United States Patent
Ahn et al.

(10) Patent No.: US 9,093,391 B2
(45) Date of Patent: Jul. 28, 2015

(54) INTEGRATED CIRCUIT PACKAGING SYSTEM WITH FAN-IN PACKAGE AND METHOD OF MANUFACTURE THEREOF

(75) Inventors: SeungYun Ahn, Ichon-si (KR); JoHyun Bae, Seoul (KR); SangJin Lee, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 108 days.

(21) Appl. No.: 12/561,897

(22) Filed: Sep. 17, 2009

(65) Prior Publication Data

US 2011/0062602 A1  Mar. 17, 2011

(51) Int. Cl.
| | |
|---|---|
| *H01L 21/00* | (2006.01) |
| *H01L 23/31* | (2006.01) |
| *H01L 21/56* | (2006.01) |
| *H01L 25/065* | (2006.01) |
| *H01L 25/10* | (2006.01) |
| *H01L 23/00* | (2006.01) |

(52) U.S. Cl.
CPC .......... *H01L 23/3128* (2013.01); *H01L 21/563* (2013.01); *H01L 25/0657* (2013.01); *H01L 25/105* (2013.01); *H01L 24/48* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73203* (2013.01); *H01L 2224/73204* (2013.01); *H01L 2224/73253* (2013.01); *H01L 2224/73265* (2013.01); *H01L 2225/0651* (2013.01); *H01L 2225/0652* (2013.01); *H01L 2225/06517* (2013.01); *H01L 2225/06541* (2013.01); *H01L 2225/1023* (2013.01); *H01L 2225/1041* (2013.01); *H01L 2225/1058* (2013.01); *H01L 2225/1088* (2013.01); *H01L 2924/01079* (2013.01); *H01L 2924/15311* (2013.01); *H01L 2924/15331* (2013.01); *H01L 2924/1815* (2013.01); *H01L 2924/19105* (2013.01); *H01L 2924/19107* (2013.01)

(58) Field of Classification Search
CPC ......... H01L 21/02; H01L 21/64; H01L 21/67; H01L 21/70; H01L 2225/1058; H01L 2224/3215; H01L 2224/73253; H01L 2224/73265
USPC .................................................. 257/787–792
See application file for complete search history.

(56) References Cited

U.S. PATENT DOCUMENTS

| | | | |
|---|---|---|---|
| 6,400,574 B1 * | 6/2002 | Stephenson et al. | 361/760 |
| 6,479,888 B1 * | 11/2002 | Hirashima et al. | 257/673 |
| 7,435,619 B2 | 10/2008 | Shim et al. | |
| 7,772,685 B2 * | 8/2010 | Huang et al. | 257/686 |
| 7,795,727 B2 * | 9/2010 | Bauer et al. | 257/723 |
| 2008/0054461 A1 * | 3/2008 | Lang et al. | 257/738 |
| 2008/0105962 A1 | 5/2008 | Lee et al. | |
| 2009/0115043 A1 | 5/2009 | Chow et al. | |
| 2009/0152740 A1 | 6/2009 | Park et al. | |
| 2009/0166835 A1 | 7/2009 | Yang et al. | |

* cited by examiner

*Primary Examiner* — Richard Booth
(74) *Attorney, Agent, or Firm* — Ishimaru & Associates LLP

(57) ABSTRACT

A method of manufacture of an integrated circuit packaging system includes: providing a base substrate; connecting a base component directly to the base substrate; mounting a stack component over the base component; attaching a flattened exposed interconnect directly on the stack component; and applying an encapsulant over the stack component with a portion of the flattened exposed interconnect exposed.

20 Claims, 4 Drawing Sheets

INTEGRATED CIRCUIT PACKAGING SYSTEM WITH FAN-IN PACKAGE AND METHOD OF MANUFACTURE THEREOF

TECHNICAL FIELD

The present invention relates generally to an integrated circuit packaging system, and more particularly to a system for a stackable package.

BACKGROUND ART

A tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

Therefore, there is an important need that exists for parts in the package to become thinner and thinner to reduce the size of the whole package effectively without sacrificing performance and speed.

Products must compete in world markets and attract many consumers or buyers in order to be successful. It is very important for products to continue to improve in features, performance, and reliability while reducing product costs, product size, and equally important to be available quickly for purchase by the consumers or buyers.

Each of the integrated circuit packages within the cell phone can contain large amounts of complex circuitry. The circuitry within each of the integrated circuit packages work and communicate with other circuitry of other integrated circuit packages and electrical parts using electrical connections on circuit boards requiring many connections between packages.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, yield, and costs of products.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; connecting a base component directly to the base substrate; mounting a stack component over the base component; attaching a flattened exposed interconnect directly on the stack component; and applying an encapsulant over the stack component with a portion of the flattened exposed interconnect exposed.

The present invention provides an integrated circuit packaging system including: a base substrate; a base component connected directly to the base substrate; a stack component over the base component; a flattened exposed interconnect directly on the stack component; and an encapsulant over the stack component with a portion of the flattened exposed interconnect exposed.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
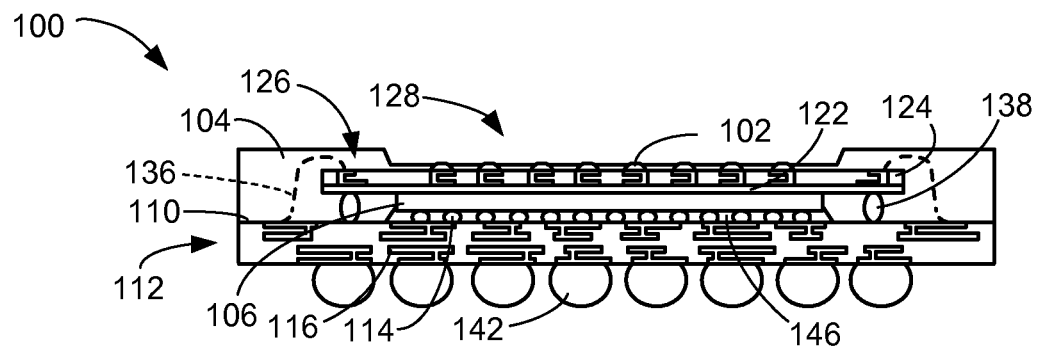
FIG. 1 is a cross-sectional view of an integrated circuit packaging system in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
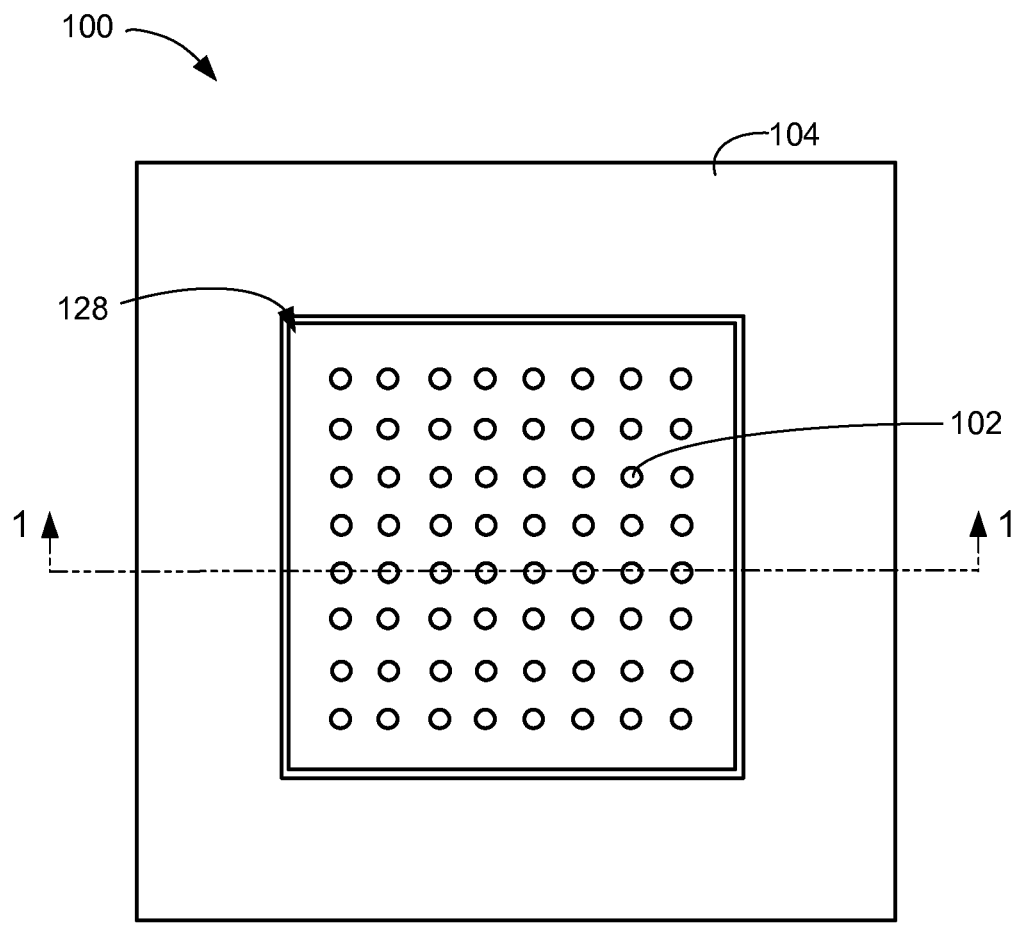
FIG. 2 is a top view of the structure of FIG. 1.

Referring now to FIG. 1, therein is shown a cross-sectional view of an integrated circuit packaging system 100 in a first embodiment of the present invention taken along a line 1-1 of FIG. 2. The integrated circuit packaging system 100 can preferably include flattened exposed interconnects 102, such as embedded solder on pads (eSOP), solder balls, solder bumps, gold, silver, copper, or other metal alloy, an encapsulant 104, and a base component 106 such as a flip chip, a wire bond chip, or a passive component.

An active side of the base component 106 can be connected directly to a component side 110 of a base substrate 112 using module interconnects 114 such as solder balls, solder bumps, or leads. Base conductors 116 can provide connectivity through the base substrate 112 including exposed portions on any side of the base substrate 112.

An attachment layer 122 covering a side of a stack component 124, such as an interposer, a flip chip, or an integrated circuit package, can be used to mount the stack component 124 over the base component 106. The stack component 124 can include extensions 126, such as a cantilevered section or an overhang of the stack component 124 extending or protruding beyond a perimeter of the base component 106.

The flattened exposed interconnects 102 can cover a side of the stack component 124 facing away from the base component 106 and provide electrical connectivity with circuitry or wiring of the stack component 124 and the integrated circuit packaging system 100. An end of the flattened exposed interconnects 102 can be flattened, such as by coining, pressing, or stamping, before encapsulation.

Internal interconnects 136, such as wires, wire bond wires, leads, pillars, or posts along a perimeter of the stack component 124, can be used to connect the side of the stack component 124 having the flattened exposed interconnects 102 to the component side 110.

Structure supports 138, such as predots, pillars, or spacers, can be connected between the stack component 124 and the component side 110 of the base substrate 112. The structure supports 138 can be located between the extensions 126 of the stack component 124 and the base substrate 112. The structure supports 138 can provide additional structural support or rigidity to the integrated circuit packaging system 100 should planar dimensions of the stack component 124 be substantially larger than planar dimensions of the base component 106.

The structure supports 138 can be isolated from the stack component 124 as a result of the structure supports 138 formed from a non-conductive material or by physically isolating the structure supports 138 from the stack component 124 or the component side 110 with an attachment layer such as an adhesive layer or spacer. The structure supports 138 could electrically connect the stack component 124 directly with the component side 110.

A single mold step of an encapsulation process can be used to form the encapsulant 104 with a depression 128 such as a crater or a surface indentation. The encapsulant 104 can protect and cover the component side 110, the internal interconnects 136, and the stack component 124. The encapsulant 104 is directly on the base substrate and on the flattened exposed interconnect 102 within the depression 128.

The encapsulant 104 can surround the base component 106 and each of the flattened exposed interconnects 102. The depression 128 can include having a portion of all of the flattened exposed interconnects 102 substantially exposed on or above the encapsulant 104. The top of the depression 128 is above the flattened exposed interconnects 102. The depression 218 has angled sides with the depression 218 wider at top than at the bottom. At least one of the flattened exposed interconnects 102 and another of the flattened exposed interconnects 102 are exposed from the encapsulant 104 within the depression 128.

The portion of the flattened exposed interconnects 102 on or above the encapsulant 104 can provide connectivity. The flattened exposed interconnects 102 can preferably have a narrower width than a typical fan-in package on package (FiPoP) to provide a narrow pitch narrower than a pitch of typical solder ball devices. For example, the flattened exposed interconnects 102 can provide a pitch of less than four tenths of a millimeter.

The flattened exposed interconnects 102 can have sufficient standoff height above the encapsulant 104 to help minimize the mold flow disturbance which may cause mold flash or bleed contamination issues with the flattened exposed interconnects 102 on the stack component 124.

System connectors 142, such as balls, bumps, leads, or wires, can connect to the base substrate 112 providing connectivity to a next level system or subsystem such as a printed circuit board, a system component, or another integrated circuit system package.

The base component 106 can optionally include an underfill 146, formed of non-electrically conductive material, such as an adhesive, an epoxy, a silicone, or a gel, used to seal or protect connections between the base component 106 and the component side 110.

The exemplary embodiment can improve surface mount technology (SMT) yield for package stacking with a flip chip fan-in package on package bottom (FiPoPb) using an eSOP. The invention provides an exposed interconnection on the top side of the FiPoPb. If a bottom device is small flip chip, a long overhang can exist and a predot can prevent the interposer from bending.

The exemplary embodiment can provide an exposed interconnection on a top side of an interposer in a flip chip FiPoPb. The flattened exposed interconnect (102) can preferably have a small size predetermined to provide more inputs or outputs than a typical fan-in package on package.

It has been discovered that the flattened exposed interconnects 102 of the present invention can have more inputs or outputs (I/O) than a typical FiPoP because ball pitch can be reduced with the application of small balls as exposed interconnections.

It has also been discovered that the integrated circuit packaging system 100 such as a FiPoPb provides improvement of surface mount technology (SMT) yield for package stacking with flip chip fan-in package on package bottom (FiPoP).

It has further been discovered that an interposer over a small flip chip can result in bending due to a long overhang that can be prevented by a predot or supporting component.

It has been found that the exemplary embodiment does not need a twice or several mold process steps to encapsulate the bottom device.

Referring now to FIG. 2, therein is shown a top view of the structure of FIG. 1. Shown are ends of each of the flattened exposed interconnects 102 substantially exposed within the depression 128 of the encapsulant 104. The flattened exposed interconnects 102 are all shown having a shape of a circle although the shape can have any shape or any different combination of shapes. The planar shape of the integrated circuit packaging system 100 is shown having a rectangular shape and can be formed having any planar shape.

Figure 3:
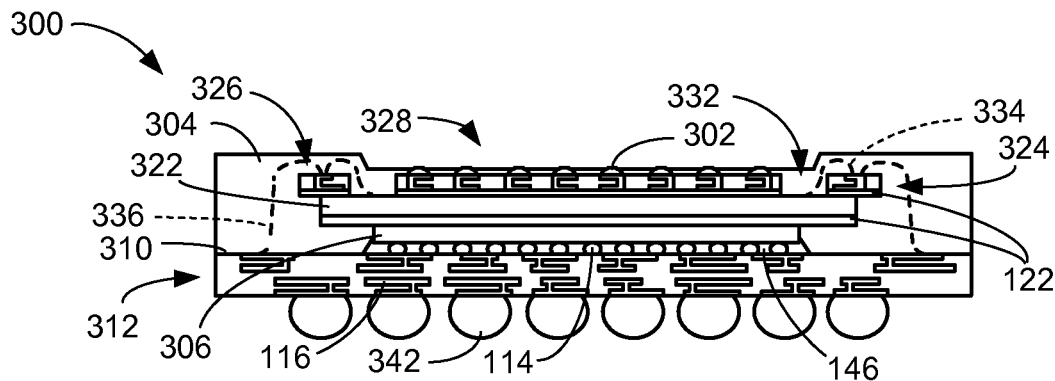
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can preferably include flattened exposed interconnects 302, such as embedded solder on pads (eSOP), solder balls, solder bumps, gold, silver, copper, or other metal alloy, an encapsulant 304, and a base component 306 such as a flip chip, a wire bond chip, or a passive component.

An end of the flattened exposed interconnects 302 can be flattened, such as by coining, pressing, or stamping, before encapsulation with the encapsulant 304. A top portion of the flattened exposed interconnects 302 can be surrounded by the encapsulant 304 with the flattened end of the flattened exposed interconnects 302 exposed at a top surface of the encapsulant 304. An active side of the base component 306 can be connected directly to the base conductors 116 of a component side 310 of a base substrate 312 using the module interconnects 114. The base component 306 can optionally include the underfill 146 to seal or protect connections between the base component 306 and the component side 310.

The attachment layer 122 covering a side of the intermediate component 322, such as a memory, a flip chip, or an integrated circuit package, can be used to mount the intermediate component 322 on the base component 306. An active side of the intermediate component 322 can preferably be oriented with to face away from the base component 306.

The attachment layer 122 can also be used to mount a stack component 324, such as an interposer, a flip chip, or an integrated circuit package, over the active side of the intermediate component 322. The stack component 324 can include extensions 326, such as a cantilevered section or an overhang of the stack component 324 extending or protruding beyond a perimeter of the intermediate component 322 or the base component 306. The flattened exposed interconnects 302 can cover a side of the stack component 324 facing away from the intermediate component 322.

The stack component 324 can preferably include through openings 332, such as holes, slots, vertical insertion areas (VIA), or combinations thereof, that extend from the side of the stack component 324 covered with the flattened exposed interconnects 302 to a side of the stack component 324 opposite the side with the flattened exposed interconnects 302. The through openings 332 can preferably be formed between an outer perimeter area having the flattened exposed interconnects 302 and a perimeter formed by the extensions 326.

Feed through connectors 334, such as wires or leads, can connect the stack component 324 to the intermediate component 322. The feed through connectors 334 can preferably be physically inserted through the through openings 332 with a portion of the feed through connectors 334 within the through openings 332. One end of each of the feed through connectors 334 can be connected to the active side of the intermediate component 322 and an opposite end of the feed through connectors 334 connected to the side of the stack component 324 having the flattened exposed interconnects 302.

Internal interconnects 336, such as wires, wire bond wires, leads, pillars, or posts, can be used to connect the side of the stack component 324 having the flattened exposed interconnects 302 to the component side 310.

A single mold step of an encapsulation process can be used to form the encapsulant 304 with a depression 328 such as a crater or similar surface indentation. The encapsulant 304 can protect and cover the component side 310, the internal interconnects 336, and the stack component 324.

The encapsulant 304 can surround the base component 306 and each of the flattened exposed interconnects 302. The depression 328 can include having a portion of all of the flattened exposed interconnects 302 substantially exposed on or above the encapsulant 304.

The portion of the flattened exposed interconnects 302 exposed within the depression 328 of the encapsulant 304 can be used to connect to a device, such as a package, discrete component, or printed circuit board to the integrated circuit packaging system 300.

System connectors 342, such as balls, bumps, leads, or wires, can connect to a side of the base substrate 312 opposite the component side 310 providing connectivity between the integrated circuit packaging system 300 and a next level system or subsystem such as a printed circuit board, a system component, or another integrated circuit system package.

The exemplary embodiment combines an application specific integrated circuit (ASIC) and a memory to reduce the package height by utilizing an interposer instead of a spacer.

Figure 4:
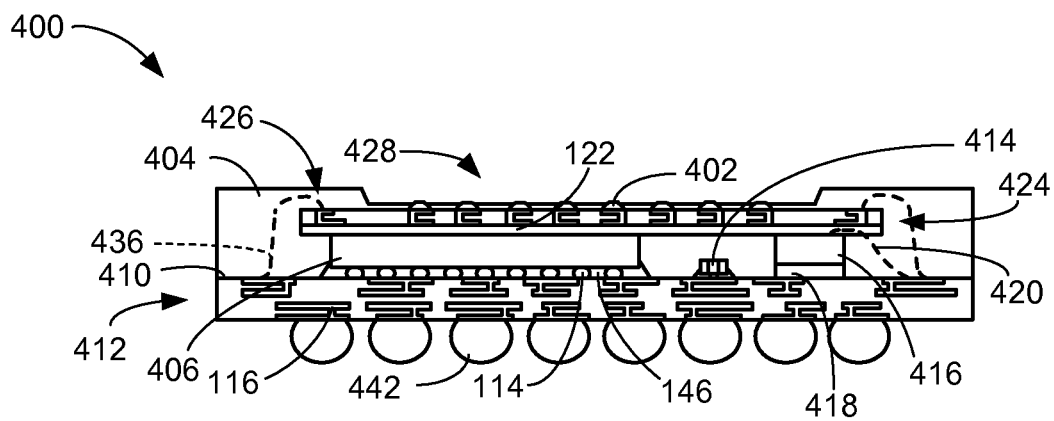
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 can preferably include flattened exposed interconnects 402, such as embedded solder on pads (eSOP), solder balls, solder bumps, gold, silver, copper, or other metal alloy, an encapsulant 404, and a base component 406 such as a flip chip, a wire bond chip, or a passive component.

An end of the flattened exposed interconnects 402 can be flattened, such as by coining, pressing, or stamping, before encapsulation with the encapsulant 404. An active side of the base component 406 can be connected directly to the base conductors 116 of a component side 410 of a base substrate 412 using the module interconnects 114.

The base component 406 can have an offset towards an end of the base substrate 412. The base component 406 can optionally include the underfill 146 to seal or protect connections between the base component 406 and the component side 410.

The base substrate 412 can include a conductive material exposed on the component side 410, a side of the base substrate 412 opposite the component side 410, and within the base substrate 412 to provide connectivity between opposite sides of the base substrate 412.

A central offset device 414, such as a passive device, a wire bond chip, or a package, can be connected to the component side 410 and located next to the base component 406 with an offset towards an end of the base substrate 412 furthest away from the base component 406. An active side of the central offset device 414 can be connected directly to the component side 410 of the base substrate 412.

A spacer device 416, such as a wire bond chip, a package, or a passive device, can be connected over or to the component side 410 and located next to the central offset device 414. The spacer device 416 can be between the central offset device 414 and the end the base substrate 412 furthest away from the base component 406. An active side of the spacer device 416 can face away from the component side 410.

The active side of the spacer device 416 can be coplanar with a side of the base component 406 opposite the active side of the base component 406 using an optional spacer 418. The optional spacer 418, such as an insulator, board, or attachment layer, can be mounted between the spacer device 416 and the component side 410.

The active side of the spacer device 416 can be connected to the component side 410 using tangential interconnects 420 such as bond wires having reverse stitch standoff bump (RSSB), low profile leads, or other similar low profile interconnects.

A stack component 424, such as an interposer, a flip chip, or an integrated circuit package, having a side covered with the flattened exposed interconnects 402 can be oriented over the base component 406 and the spacer device 416 next to the central offset device 414. The stack component 424 can include extensions 426, such as a cantilevered section or an overhang of the stack component 424 extending or protruding beyond a perimeter area having the base component 406, the central offset device 414, or the spacer device 416.

The attachment layer 122, covering a side of the stack component 424, can be used to mount the stack component 424 on to the base component 406 and the active side of the spacer device 416. The attachment layer 122 can cover or surround a portion of the tangential interconnects 420.

The base component 406 or the spacer device 416 can provide additional structural support or rigidity to the integrated circuit packaging system 400 should the extensions 426 protrude substantially away from an aggregate area having the base component 406, the central offset device 414, and the spacer device 416.

The flattened exposed interconnects 102 can cover a side of the stack component 124 facing away from the base component 106.

Internal interconnects 436, such as wires, wire bond wires, leads, pillars, or posts, can be used to connect the side of the stack component 424 having the flattened exposed interconnects 402 to the component side 410.

A single mold step of an encapsulation process can be used to form the encapsulant 404 with a depression 428 such as a crater or similar surface indentation. The encapsulant 404 can protect and cover the component side 410, the internal interconnects 436, and the stack component 424.

The encapsulant 404 can surround the base component 406, the central offset device 414, the spacer device 416, and each of the flattened exposed interconnects 402. The depression 428 can include having a portion of all of the flattened exposed interconnects 402 substantially exposed on or above the encapsulant 404.

The portion of the flattened exposed interconnects 402 exposed within the depression 428 of the encapsulant 404 can be used to connect to a device, such as a package, discrete component, or printed circuit board to the integrated circuit packaging system 400.

System connectors 442, such as balls, bumps, leads, or wires, can connect to a side of the base substrate 412 opposite the component side 410 providing connectivity between the integrated circuit packaging system 400 and a next level system or subsystem such as a printed circuit board, a system component, or another integrated circuit system package.

The exemplary embodiment exemplifies a system in package (SIP) system having multiple functions in a flip chip fan-in package on package base (fcFiPoPb).

Figure 5:
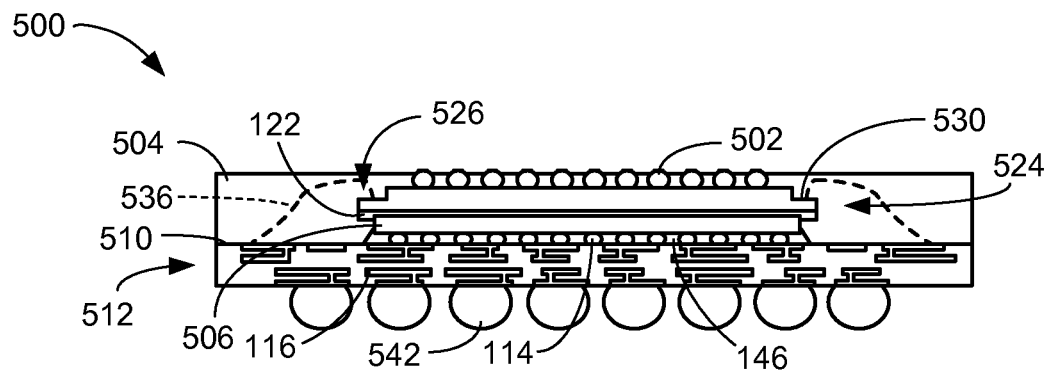
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 can preferably include flattened exposed interconnects 502, such as embedded solder on pads (eSOP), solder balls, solder bumps, gold, silver, copper, or other metal alloy.

The integrated circuit packaging system 500 can also include an encapsulant 504, and a base component 506 such as a flip chip, a wire bond chip, or a passive component. An end of the flattened exposed interconnects 502 can be flattened such as by coining, pressing, or stamping before encapsulation with the encapsulant 504.

An active side of the base component 506 can be connected directly to the base conductors 116 of a component side 510 of a base substrate 512 using the module interconnects 114. The base component 506 can optionally include the underfill 146 to seal or protect connections between the base component 506 and the component side 510.

The attachment layer 122 covering a side of a stack component 524, such as an interposer, a flip chip, or an integrated circuit package, can be used to mount the stack component 524 over the base component 506. The stack component 524 can include extensions 526, such as a cantilevered section or an overhang of the stack component 524 extending or protruding beyond a perimeter of the base component 506.

The flattened exposed interconnects 502 can cover a side of the stack component 524 facing away from the base component 506 and provide electrical connectivity with circuitry or wiring of the stack component 524 and the integrated circuit packaging system 500.

The stack component 524 can include a lowered surface 530 formed on the extensions 526 around a perimeter of the flattened exposed interconnects 502 on the active side of the stack component 524.

The lowered surface 530, such as a down step, a lowered shelf, or dropped surface of the extensions 526, can include areas having connectivity to circuitry of the stack component 524. The lowered surface 530 can be used to directly connect the stack component 524 with the component side 510 using internal interconnects 536 such as wire bond wires, wires, or leads.

A single mold step of an encapsulation process can be used to form the encapsulant 504 to protect and cover the component side 510, the internal interconnects 536, and the stack component 524.

The encapsulant 504 can surround the base component 506 and each of the flattened exposed interconnects 502. A portion of the flattened exposed interconnects 502 exposed above the encapsulant 504 can provide connectivity to a device, such as a package, discrete component, or printed circuit board, having a narrow pitch narrower than a pitch of typical solder ball devices. The flattened exposed interconnects 502 can provide connectivity to devices having a pitch of less than four tenths of a millimeter.

System connectors 542, such as balls, bumps, leads, or wires, can connect to a side of the base substrate 512 opposite the component side 510 providing connectivity between the integrated circuit packaging system 500 and a next level system or subsystem such as a printed circuit board, a system component, or another integrated circuit system package.

An overall z-height of the integrated circuit packaging system 500 with the stack component 524 having the lowered surface 530 can be lower than an overall z-height of the integrated circuit packaging system 100 of FIG. 1 having the depression 128 of FIG. 1.

The exemplary embodiment can use bumps to connect to an interposer and wire bonding wires to connect the interposer to a substrate.

Figure 6:
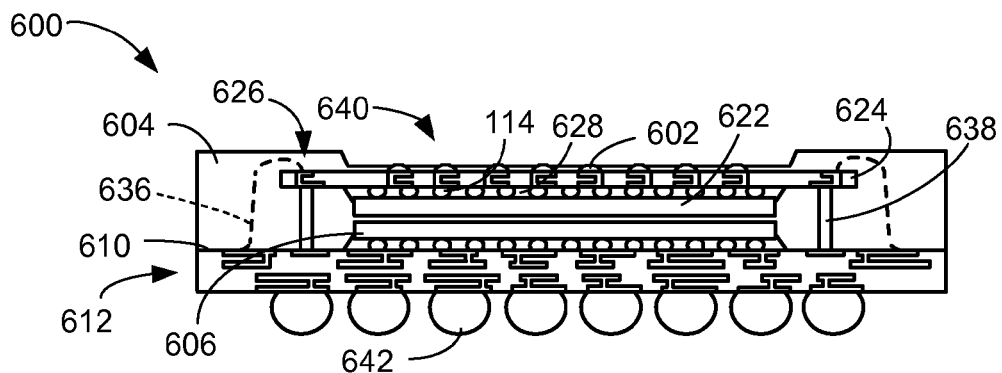
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The integrated circuit packaging system 600 can include flattened exposed interconnects 602 substantially similar to the flattened exposed interconnects 102 of FIG. 1. An end of the flattened exposed interconnects 602 can be flattened, such as by coining, pressing, or stamping.

The integrated circuit packaging system also can include an encapsulant 604 substantially the same as the encapsulant 104 of FIG. 1, and a base component 606, a component side 610, and a base substrate 612. An end of the flattened exposed interconnects 602 can be flattened such as by coining, pressing, or stamping before encapsulation with the encapsulant 604.

In a manner similar to the base component 106 of FIG. 1, the base component 606 can be connected directly to the component side 610 of the base substrate 612. An active side of an intermediate component 622, such as a flip chip, a memory, or an integrated circuit package, can be connected directly to a side of a stack component 624 such as an interposer, a flip chip, or an integrated circuit package using the module interconnects 114.

The stack component 624 can include extensions 626, such as a cantilevered section or an overhang of the stack component 624 extending or protruding beyond a perimeter of the base component 606.

In a manner similar to the flattened exposed interconnects 102, the flattened exposed interconnects 602 can connect to a side of the stack component 624 opposite the side of the stack component 624 connected to the intermediate component 622. The intermediate component 622 can optionally include an underfill 628, similar to the underfill 146 of FIG. 1, to seal or protect connections between the intermediate component 622 and the stack component 624.

Internal interconnects 636, such as wires, wire bond wires, leads, pillars, or posts along a perimeter of the stack component 624, can be used to connect the side of the stack component 624 having the flattened exposed interconnects 602 to the component side 610.

The stack component 624 can be located over the base component 606 with the intermediate component 622 oriented between the stack component 624 and the base component 606. The side of the stack component 624 having with the flattened exposed interconnects 602 can preferably face away from the base component 606.

Structure supports 638, such as such as pillars, predots, or spacers, can be connected between the stack component 624 and the component side 610 of the base substrate 612. The structure supports 638, located between the extensions 626 of the stack component 624 and the base substrate 612, can provide additional structural support or rigidity to the exemplary embodiment should planar dimensions of the stack component 624 be substantially larger than planar dimensions of the base component 606.

The structure supports 638 can electrically connect the stack component 624 directly with the component side 610. The structure supports 638 could be isolated from the stack component 624 as a result of the structure supports 638 formed from a non-conductive material or by physically isolating the structure supports 638 from the stack component 624 or the component side 610 with an attachment layer such as an adhesive layer or spacer.

A single mold step of an encapsulation process can be used to form the encapsulant 604 with a depression 640 such as a crater or a surface indentation. The encapsulant 604 can protect and cover the component side 610, the internal interconnects 636, and the stack component 624.

The encapsulant 604 can surround the base component 606 and each of the flattened exposed interconnects 602. The depression 640 can include having a portion of all of the flattened exposed interconnects 602 substantially exposed on or above the encapsulant 604.

System connectors 642 substantially similar to the system connectors 142 of FIG. 1 can connect to a side of the base substrate 612 opposite the component side 610 to provide connectivity between the integrated circuit packaging system 600 and a next level system or subsystem such as a printed circuit board, a system component, or another integrated circuit system package.

The exemplary embodiment can utilize two flip chips to have another function such as ASIC, modem etc. Interconnection pillars can electrically connect between an interposer and a base substrate and can support the interposer from bending due to an overhang.

Figure 7:
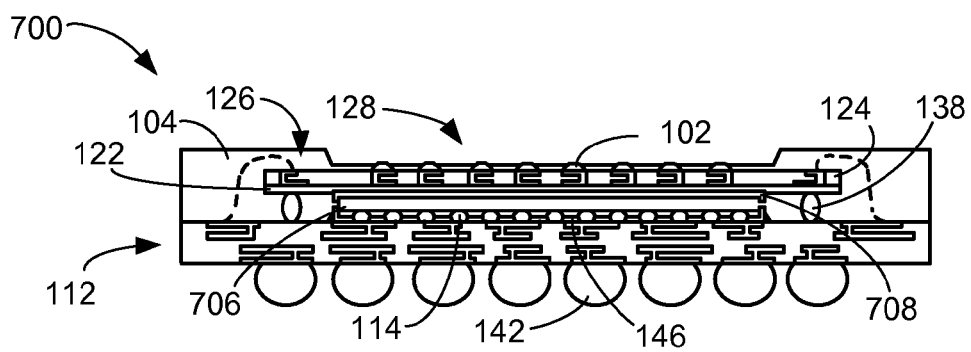
FIG. 7 is a cross-sectional view of an integrated circuit packaging system in a sixth embodiment of the present invention.

Referring now to FIG. 7, therein is shown a cross-sectional view of an integrated circuit packaging system 700 in a sixth embodiment of the present invention. The integrated circuit packaging system 700 can be substantially similar to the integrated circuit packaging system 100 of FIG. 1 except a base component 706 can be enclosed or surrounded with a thermal conductive layer 708.

The thermal conductive layer 708, such as a non-electrically conductive heat spreader, a thermal gel, or a combination thereof, can preferably be formed around the base component 706 and the module interconnects 114 used to connect the base component 706 to the base substrate 112. The thermal conductive layer 708 can optionally be formed from two or more individual sections.

The integrated circuit packaging system 700 is also shown with the underfill 146, the flattened exposed interconnects 102, the encapsulant 104, the stack component 124 having the extensions 126, the depression 128, the structure supports 138, the attachment layer 122, and the system connectors 142.

The underfill 146 is shown sealing or protecting connections between the base component 706 and the base substrate 112. The stack component 124 is mounted over the thermal conductive layer 708 using the attachment layer 122. The structure supports 138 are located between the extensions 126 of the stack component 124 and the base substrate 112.

The depression 128 of the encapsulant 104 is shown having the flattened exposed interconnects 102 exposed on or above the encapsulant 104. The system connectors 142 are shown attached to a side of the base substrate 112 facing away from the base component 706.

It has been discovered that thermal conductivity of a flip chip in the integrated circuit packaging system 700 can be enhanced with a heat spreader attached around a flip chip.

Figure 8:
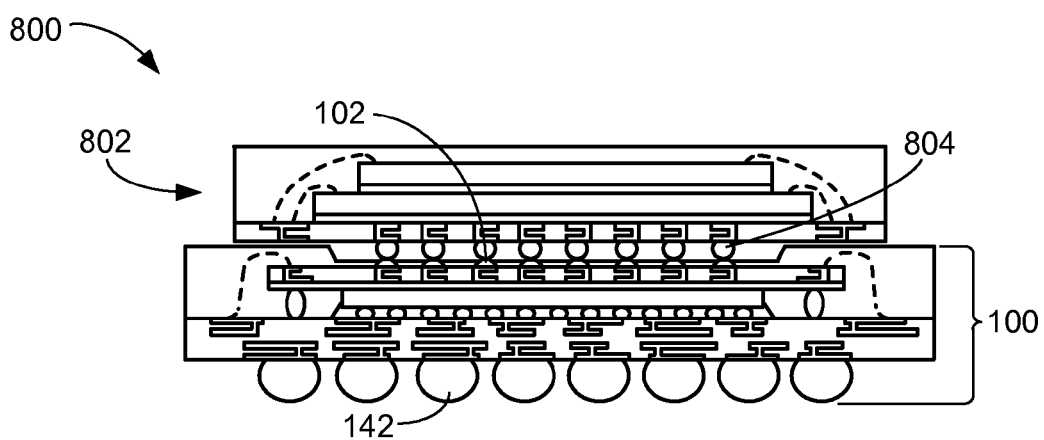
FIG. 8 is a cross-sectional view of an integrated circuit packaging system in a seventh embodiment of the present invention.

Referring now to FIG. 8, therein is shown a cross-sectional view of an integrated circuit packaging system 800 in a seventh embodiment of the present invention. The integrated circuit packaging system 800 can include the integrated circuit packaging system 100 and a stack package 802.

The stack package 802, such as a multiple component package (MCP), can include memory chips, multiple chips, or combinations thereof. The stack package 802 can be connected over the base package assembly 144 using package connectors 804

The package connectors 804, embedded solder on pads (eSOP), solder balls, or solder bumps, can connect directly to the flattened exposed interconnects 102 of the integrated circuit packaging system 100. The package connectors 804 of the stack package 802 can have a pitch of less than four tenths of a millimeter to provide an increased input/output count over an input/output count of a general fan-in package on package (FiPoP).

The system connectors 142 can be used to connect the integrated circuit packaging system 800 to another level of integration such as a printed circuit board, a system component, or another integrated circuit system package.

Figure 9:
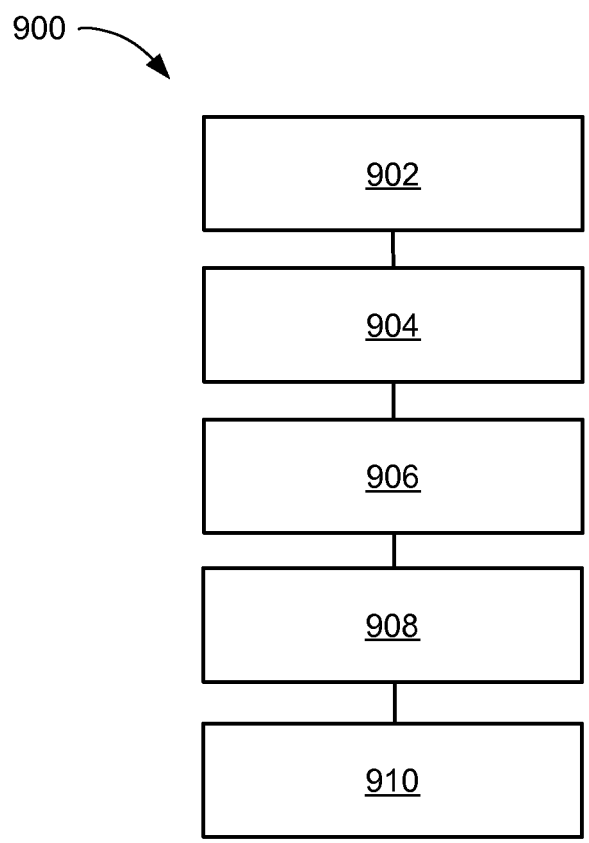
FIG. 9 is a flow chart of a method of manufacture of an integrated circuit packaging system in a further embodiment of the present invention.

Referring now to FIG. 9, therein is shown a flow chart of a method 900 of manufacture of an integrated circuit packaging system in a further embodiment of the present invention. The method 900 includes providing a base substrate in a block 902; connecting a base component directly to the base substrate in a block 904; mounting a stack component over the base component in a block 906; attaching a flattened exposed interconnect directly on the stack component in a block 908; and applying an encapsulant over the stack component with a portion of the flattened exposed interconnect exposed in a block 910.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;
   connecting a base component to the base substrate;
   mounting a stack component over the base component;
   attaching a flattened exposed interconnect directly on the stack component;
   flattening an end of the flattened exposed interconnect; and
   forming an encapsulant covering the stack component, the encapsulant having a depression, the encapsulant directly on the base substrate and the flattened exposed interconnect, and the flattened end of the flattened exposed interconnect and another of the flattened exposed interconnect both exposed from the encapsulant in the depression in the encapsulant.

2. The method as claimed in claim 1 further comprising connecting a stack package to the flattened exposed interconnect.

3. The method as claimed in claim 1 further comprising connecting an intermediate component to the stack component with the intermediate component between the stack component and the base component.

4. The method as claimed in claim 1 wherein applying the encapsulant includes forming the depression wider at the top in the encapsulant.

5. The method as claimed in claim 1 further comprising:
   connecting a central offset device to the base substrate with the central offset device next to the base component; and
   connecting a spacer device over the base substrate with the spacer device next to the central offset device.

6. A method of manufacture of an integrated circuit packaging system comprising:
   providing a base substrate;
   connecting a base component directly to the base substrate;
   mounting a stack component over the base component;
   attaching a flattened exposed interconnect directly on the stack component;
   flattening an end of the flattened exposed interconnect; and
   forming an encapsulant covering the stack component, the encapsulant having a depression, the encapsulant directly on the base substrate and the flattened exposed interconnect, and the flattened end of the flattened exposed interconnect and another of the flattened exposed interconnect both exposed from the encapsulant in the depression in the encapsulant.

7. The method as claimed in claim 6 further comprising:
   forming a lowered surface on the stack component with the lowered surface around the stack component; and
   connecting an internal interconnect between the lowered surface and the base substrate.

8. The method as claimed in claim 6 further comprising forming a thermal conductive layer around the base component.

9. The method as claimed in claim 6 further comprising:
   forming the stack component with a through opening between the flattened exposed interconnect and an extension of the stack component; and
   mounting an intermediate component between the stack component and the base component; and
   connecting a feed through connector between the intermediate component and the stack component and having a portion of the feed through connector within the through opening.

10. The method as claimed in claim 6 further comprising connecting a structure support between an extension of the stack component and the base substrate.

11. An integrated circuit packaging system comprising:
    a base substrate;
    a base component connected to the base substrate;
    a stack component over the base component;

a flattened exposed interconnect, having a flattened end, directly on the stack component; and an encapsulant covering the stack component, the encapsulant having a depression, the encapsulant directly on the base substrate and the flattened exposed interconnect, and the flattened end of the flattened exposed interconnect and another of the flattened exposed interconnect both exposed from the encapsulant in the depression in the encapsulant.

12. The system as claimed in claim 11 further comprising a stack package connected to the flattened exposed interconnect.

13. The system as claimed in claim 11 further comprising an intermediate component connected to the stack component with the intermediate component between the stack component and the base component.

14. The system as claimed in claim 11 wherein the encapsulant includes the depression formed in the encapsulant is wider at the top.

15. The system as claimed in claim 11 further comprising:
a central offset device connected to the base substrate with the central offset device next to the base component; and
a spacer device connected over the base substrate with the spacer device next to the central offset device.

16. The system as claimed in claim 11 wherein the base component is connected directly to the base substrate.

17. The system as claimed in claim 16 further comprising:
a lowered surface formed on the stack component with the lowered surface around the stack component; and
an internal interconnect connected between the lowered surface and the base substrate.

18. The system as claimed in claim 16 further comprising a thermal conductive layer formed around the base component.

19. The system as claimed in claim 16 wherein:
the stack component formed with a through opening between the flattened exposed interconnect and an extension of the stack component; and further comprising:
an intermediate component mounted between the stack component and the base component; and
a feed through connector connected between the intermediate component and the stack component and having a portion of the feed through connector within the through opening.

20. The system as claimed in claim 16 further comprising a structure support connected between an extension of the stack component and the base substrate.

* * * * *